US005828325A

United States Patent [19]

Wolosewicz et al.

[11] Patent Number: 5,828,325

[45] Date of Patent: Oct. 27, 1998

[54] APPARATUS AND METHOD FOR ENCODING AND DECODING INFORMATION IN ANALOG SIGNALS

[75] Inventors: Jack Wolosewicz, Boston; Kanaan Jemili, Wourn, both of Mass.

[73] Assignee: Aris Technologies, Inc., Cambridge, Mass.

[21] Appl. No.: 627,107

[22] Filed: Apr. 3, 1996

[51] Int. Cl.[6] .......... H03M 7/00

[52] U.S. Cl. .......... 341/52

[58] Field of Search .......... 341/52; 386/94; 395/2.19, 2.2, 2.34; 360/60, 15; 375/317; 380/3

[56] References Cited

U.S. PATENT DOCUMENTS

| | | | |
|---|---|---|---|
| 4,706,282 | 11/1987 | Knowd | 380/3 |
| 4,972,471 | 11/1990 | Gross et al. . | |
| 4,979,210 | 12/1990 | Nagata et al. | 380/3 |
| 5,251,041 | 10/1993 | Young et al. | 358/310 |
| 5,402,488 | 3/1995 | Karlock | 380/5 |

FOREIGN PATENT DOCUMENTS

| | | |
|---|---|---|
| 2260246 | 4/1993 | United Kingdom . |
| 2292506 | 2/1996 | United Kingdom . |
| 9410771 | 5/1994 | WIPO . |

*Primary Examiner*—Brian K. Young
*Attorney, Agent, or Firm*—Rothwell, Figg, Ernst & Kurz

[57] ABSTRACT

A method and apparatus for encoding information symbols onto an analog host signal modifies signal peaks of the host signal to fall within predetermined amplitude bands. A set of symbols is defined wherein each symbol corresponds to a defined number of signal peaks or to a particular value of signal peak within a band. An additional information channel may be created by altering polarity changes of signal peaks in accordance with predetermined polarity sequences to represent a second set of defined symbols.

18 Claims, 8 Drawing Sheets

R- reference peak $P_A$- altered peak

Normalized peak values ⟶ $NR = \frac{K}{R} \times R = K$ $$NP_A = \frac{K}{R} \times P_A$$

Low Bandwidth - 100Hz Packet

High Bandwith - 1KHz packet

APPARATUS AND METHOD FOR ENCODING AND DECODING INFORMATION IN ANALOG SIGNALS

BACKGROUND OF THE INVENTION

1. Field of the Invention

This invention relates to apparatus and methods for encoding and decoding information in analog signals, such as audio, video and data signals, either transmitted by radio wave transmission or wired transmission, or stored in a recording medium such as optical or magnetic disks, magnetic tape, or solid state memory.

2. Background and Description of Related Art

An area of particular interest to certain embodiments of the present invention relates to the market for musical recordings. Currently, a large number of people listen to musical recordings on radio or television. They often hear a recording which they like enough to purchase, but don't know the name of the song, the artist performing it, or the record, tape, or CD album of which it is part. As a result, the number of recordings which people purchase is less than it otherwise would be if there was a simple way for people to identify which of the recordings that they hear on the radio or TV they wish to purchase.

Another area of interest to certain embodiments of the invention is copy control. There is currently a large market for audio software products, such as musical recordings. One of the problems in this market is the ease of copying such products without paying those who produce them. This problem is becoming particularly troublesome with the advent of recording techniques, such as digital audio tape (DAT), which make it possible for copies to be of very high quality. Thus it would be desirable to develop a scheme which would prevent the unauthorized copying of audio recordings, including the unauthorized copying of audio works broadcast over the airwaves.

Various prior art methods of encoding additional information onto a source signal are known. For example, it is known to pulse-width modulate a signal to provide a common or encoded signal carrying at least two information portions or other useful portions. In U.S. Pat. No. 4,497,060 to Yang (1985) binary data is transmitted as a signal having two differing pulse-widths to represent logical "0" and "1" (e.g., the pulse-width durations for a "1" are twice the duration for a "0"). This correspondence also enables the determination of a clocking signal.

U.S. Pat. No. 4,937,807 to Weitz et al. (1990) discloses a method and apparatus for encoding signals for producing sound transmissions with digital information to enable addressing the stored representation of such signals. Specifically, the apparatus in Weitz et al. converts an analog signal for producing such sound transmissions to clocked digital signals comprising for each channel an audio data stream, a step-size stream and an emphasis stream.

With respect to systems in which audio signals produce audio transmissions, U.S. Pat. Nos. 4,876,617 to Best et al. (1989) and 5,113,437 to Best et al. (1992) disclose encoders for forming relatively thin and shallow (e.g., 150 Hz wide and 50 dB deep) notches in mid-range frequencies of an audio signal. The earlier of these patents discloses paired notch filters centered about the 2883 Hz and 3417 Hz frequencies; the later patent discloses notch filters but with randomly varying frequency pairs to discourage erasure or inhibit filtering of the information added to the notches. The encoders then add digital information in the form of signals in the lower frequency indicating a "0" and in the higher frequency a "1". In the later Best et al. patent an encoder samples the audio signal, delays the signal while calculating the signal level, and determines during the delay whether or not to add the data signal and, if so, at what signal level. The later Best et al. patent also notes that the "pseudo-random manner" in moving the notches makes the data signals more difficult to detect audibly.

The prior art fails to provide a method and an apparatus for encoding and decoding analog audio frequency signals for producing humanly perceived audio transmissions with signals that define digital information such that the audio frequency signals produce substantially identical humanly perceived audio transmission prior to and after encoding. The prior art also fails to provide relatively simple apparatus and methods for encoding and decoding audio frequency signals for producing humanly perceived audio transmissions with signals defining digital information. The prior art also fails to disclose a method and apparatus for limiting unauthorized copying of audio frequency signals for producing humanly perceived audio transmissions.

SUMMARY OF THE INVENTION

The present invention provides apparatus and methods for encoding, storing and decoding information on an analog source signal in a way which has minimal impact on the human perception of the source information when the signal is applied to an appropriate output device, such as a speaker or a display monitor.

The present invention further provides apparatus and methods for encoding, storing and decoding machine readable signals in an audio signal which control the ability of a device to copy the audio signal.

Still further, the present invention provides apparatus and methods for keeping track of the identity of audio recordings which are transmitted over radio or television broadcasts.

In particular, the present invention provides a method for encoding information symbols onto an analog host signal, comprising the steps of identifying signal peaks of the host signal within a predetermined time interval, which peaks have values within a preselected range, modifying the values of identified signal peaks to fall within a first predetermined band, defining a set of a plurality of symbols wherein each symbol corresponds to a defined number of signal peaks, and further modifying the values of identified signal peaks within the first predetermined band, according to the symbol desired to be encoded in the predetermined time interval, such that the number of signal peaks remaining within a second predetermined band within the first predetermined band corresponds to the desired symbol.

The present invention further provides apparatus for encoding information in accordance with the above method, and a method and apparatus for decoding the encoded information on the host signals.

BRIEF DESCRIPTION OF THE DRAWINGS

These and other aspects of the present invention will become more fully understood from the following detailed description of the preferred embodiments in conjunction with the accompanying drawings, in which.

DESCRIPTION OF THE PREFERRED EMBODIMENTS

The present invention is based on the novel principle of using a host signal as a carrier of encoded information as opposed to treating the host signal as noise, as in prior encoding schemes. Prior art encoding methods typically were designed to work with a host signal which is unknown and unpredictable, and therefore rejected as noise at the decoder.

According to the present invention, the host signal (such as an audio or video signal) is used as a carrier of encoded information. When treated as noise, host signal rejection is the main limitation as far as performance characteristics are concerned, because the host signal is several orders of magnitude larger than any other noise source such as distortion or additive noise. Avoiding the necessity of host rejection enables the present invention to achieve orders of magnitude better performance in terms of signal-to-noise ratio, while at the same time being computationally simpler.

According to the present invention, the host signal is observed for the occurrence of peak events within predetermined intervals of time, and suitable peak events are incrementally altered in amplitude to represent information symbols, such as binary ones and zeros. One preferred embodiment of the invention will now be described with reference to FIGS. 1–5.

Figure 1:
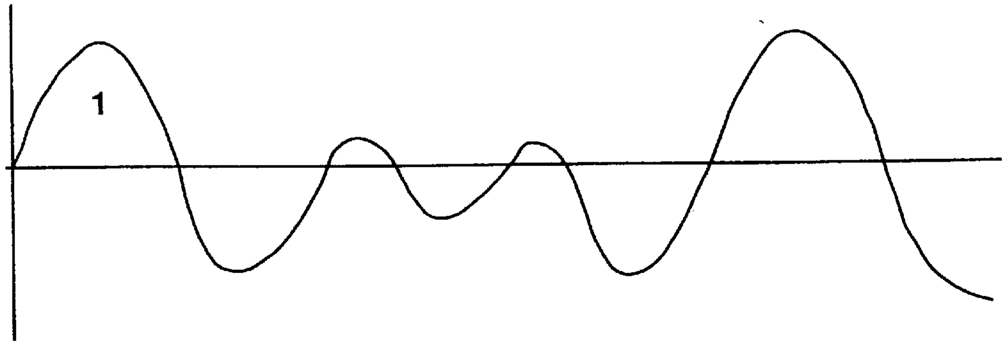
FIG. 1 is a waveform diagram of a host analog signal.

An original analog host signal shown in FIG. 1 is observed for the occurrence of signal peaks within a predetermined time interval. For purposes of illustration, such a time interval may be 0.1 sec.; however any value may be chosen, the only criterion being a sufficient number of peaks occurring within the interval to allow suitable encoding which will survive the level of expected noise.

Figure 2:
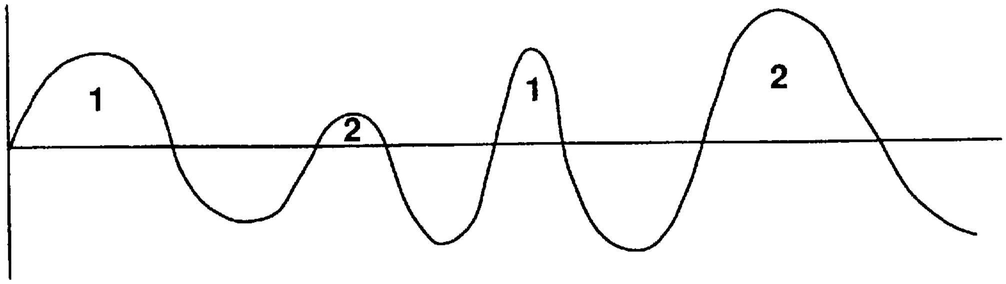
FIG. 2 is a waveform diagram of a host analog signal with signal peaks scaled by a predetermined constant.
Figure 3:
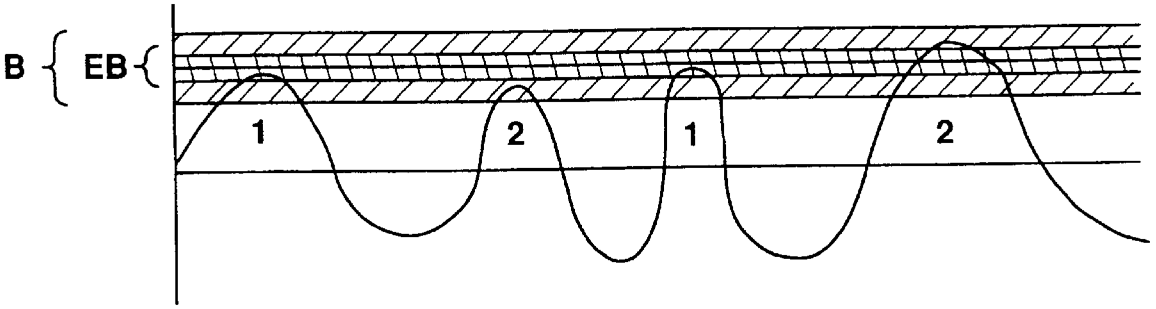
FIG. 3 is a waveform diagram of the signal of FIG. 2 with signal peaks scaled to fall within a predetermined band B.

As shown in FIG. 2, all major peaks 1 of similar value within the time frame under consideration are identified whose values are approximately equal to a constant, K. The peaks are then scaled by coarse increments of full value (wherein all bits are 1) to the constant K. The constant K can be any value between zero and full value. For purposes of illustration, K is chosen as one-tenth full value. The coarse increment also may be on the order of one-tenth full value. As a result, all major peaks fall within a first predetermined band B, surrounding the constant level K, as shown in FIG. 3, while some peaks will fall within a second predetermined narrow band EB (called the event band) within band B. It is the presence or absence of peaks within the event band EB which is used to encode information onto the host signal.

Figure 4:
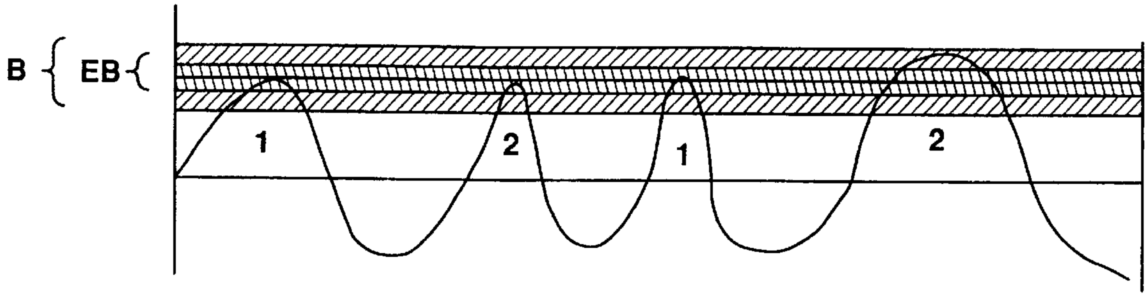
FIG. 4 is a waveform diagram of the signal of FIG. 3 with signal peaks within band B further scaled to fall within predetermined narrow band EB according to the information desired to be encoded in each time interval.

For example, the encoding scheme may be such that a pair of peaks must be detected within EB during the predetermined time interval to indicate a binary "1" for digital encoding. If less than a pair of peaks is detected, this indicates a binary "0", as shown in FIG. 4. Alternatively, any number of peaks may be selected as the "event" which must be detected in the selected time interval to indicate a "1", otherwise a "0" will be encoded. For example, encoding events may be represented by any number from a single peak to the highest number of peaks naturally occurring within the selected time interval (which will vary according to the frequency content of the host signal).

Many different encoding schemes are possible. For example, in a digital encoding scheme, the signal peaks may be manipulated so that the event band must be empty for a digital "0", by modifying the peaks to be either above or below the event band EB within the time frame. If any peaks are detected, they will be treated as representing a digital "1". Alternatively, an event may be defined as 10 peaks occurring within EB to designate a digital "1". If less than 10 peaks are detected, the time frame will be encoded as a "0".

Figure 5:
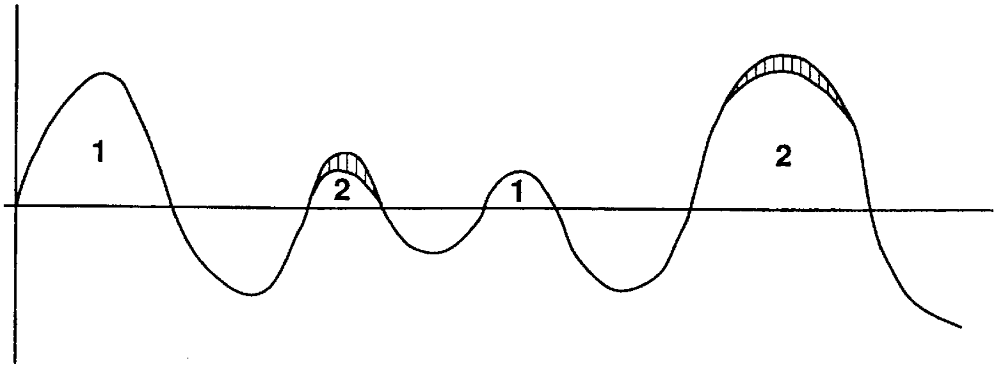
FIG. 5 is a waveform of the modified host signal after being scaled by the inverse constant of FIG. 2.

After the fine scaling has been completed, the host signal peaks are inversely scaled by the original coarse scaling, to reconstitute the original host signal, with peak alterations added, as shown in FIG. 5. Decoding at a receiving apparatus is accomplished simply by scaling incoming peaks to the constant K and detecting peak values falling within the predefined bands B and EB.

Figure 6:
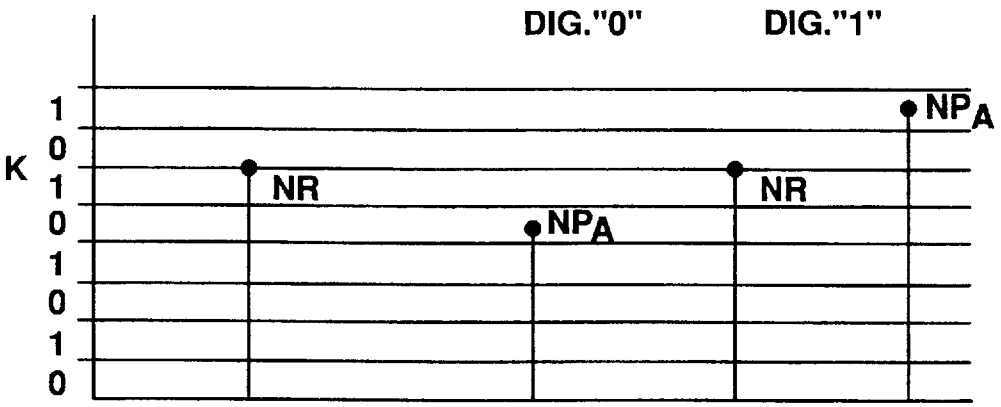
FIG. 6 is a diagram showing normalized peak values for encoded information according to one alternative embodiment of the invention.
Figure 7:
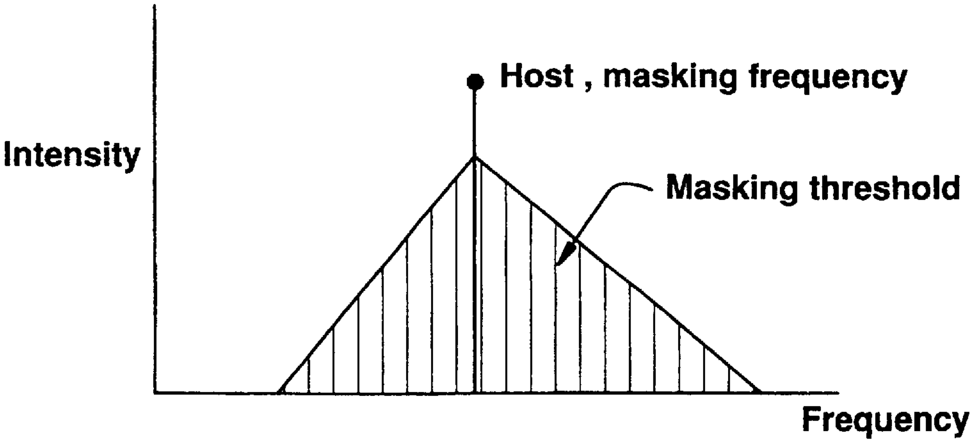
FIG. 7 is a diagram illustrating a masking curve profile.

An alternative embodiment of the invention is shown in FIG. 6. In this embodiment, a plurality of bands are defined around the constant K, alternating between "0" and "1". A reference peak NR is provided for synchronization purposes in detecting altered peak values, $P_A$. If a "0" is to be encoded, the corresponding peak is scaled to fall within the closest "0" band, and if a "1" is to be encoded, the corresponding peak is scaled to fall within the closest "1" band. Modification or scaling of any peak to fall within an appropriate band requires only a small adjustment in amplitude, thus the altering signal is an inband alteration, which occurs exactly at the host signal frequency. This approach takes advantage of the known psychoacoustic phenomenon that a signal is perceptively masked by another stronger signal of a similar frequency, which has characteristics which fall under the curve shown in FIG. 7. See Beerends et al., "A Perceptual Audio Quality Measure Based on a Psychoacoustic Sound Representation," J. Audio Eng. Soc., Vol. 40, No. 12, December 1992. The present encoding method places the altering signal right at the center of the masking curve. As a result, the information encoding is completely imperceptible to the ordinary listener.

According to one preferred embodiment, reference peaks NR are spaced from altered peaks $NP_A$ by 5 peaks to further reduce the perception level by an order of magnitude. The relationship between each peak pair (NR and $NP_A$) is defined as an event. If 10 events are used to signify digital "1"s and "0"s, for example, in the case of an analog audio signal having a median frequency of 5 kHz, a bit rate of 50 bps per channel or 100 bps for a stereo signal would be achieved, for a very robust signal survivable in a noisy analog environment. For digital transmission or recorded applications such as compact optical disks, the redundancy requirements are not needed and may be discarded, yielding a tenfold increase in bit rate to 1 kbps stereo.

Figure 8A:
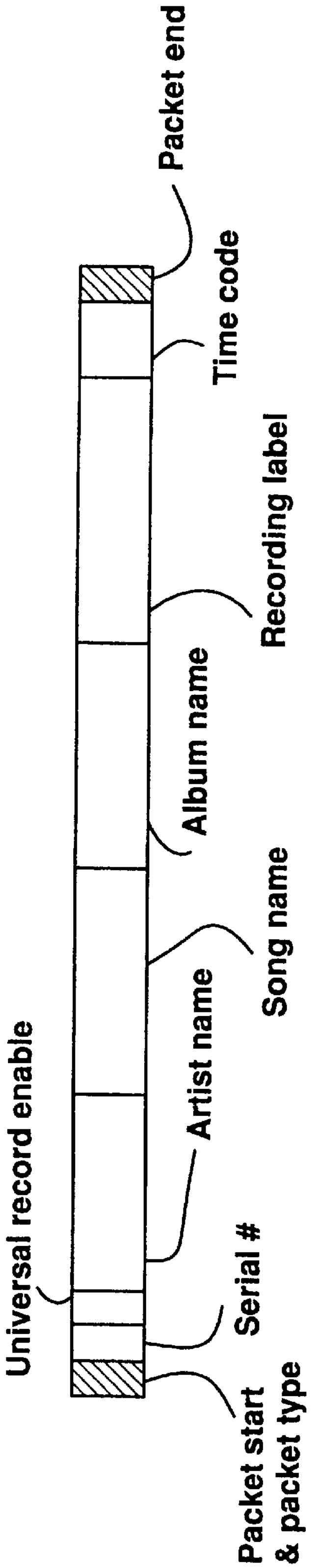
FIGS. 8A and 8B are diagrams illustrating possible formats of encoded information according to the present invention.
Figure 8B:
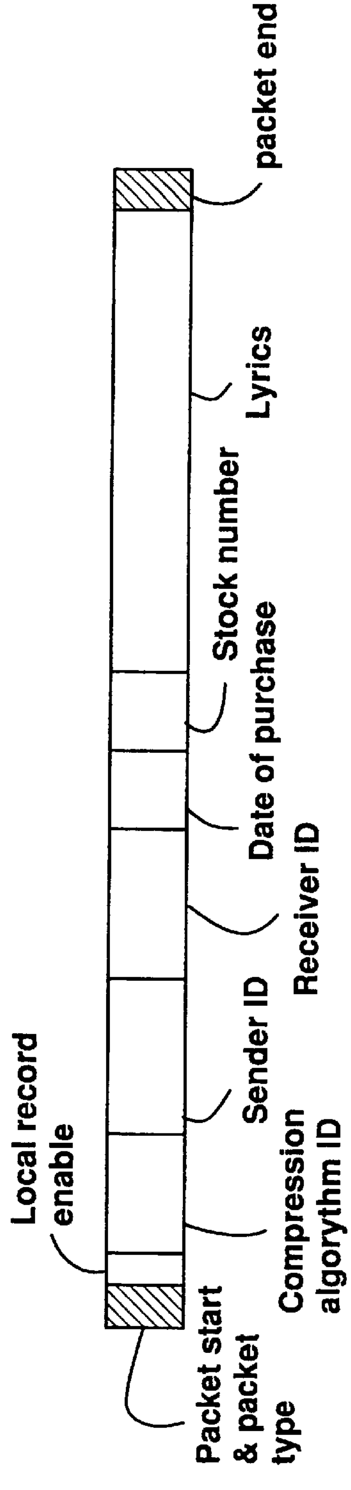

One preferred format for encoded information is shown in FIGS. 8A and 8B. FIG. 8A shows a packet structure for low bandwidth encoding (to 100 Hz). The beginning of the packet contains a packet start and packet type field, followed by a serial number field, a record enable field, and various information fields such as artist name, song name, album name, recording label, and time code. The end of the packet is denoted by a packet end field.

FIG. 8B shows a packet structure for high bandwidth encoding (up to 1 kHz). In addition to packet start and end fields, the packet may contain fields designating a compression algorithm ID, sender ID, receiver ID, date of purchase of the recorded program, stock number, and lyrics. The record enable fields comprise codes which will enable a recording device if a disable chip is built into such a device. Inability to read the enable field will render copying impossible. A universal record enable field would be present if the particular program or piece of music carrying the encoded information is in the public domain. A mix of both packet types may be included in the same host signal, such that the higher bandwidth packets may be decoded under low noise environments, while the low bandwidth packets may be decoded even in the presence of additive noise.

Figure 9:
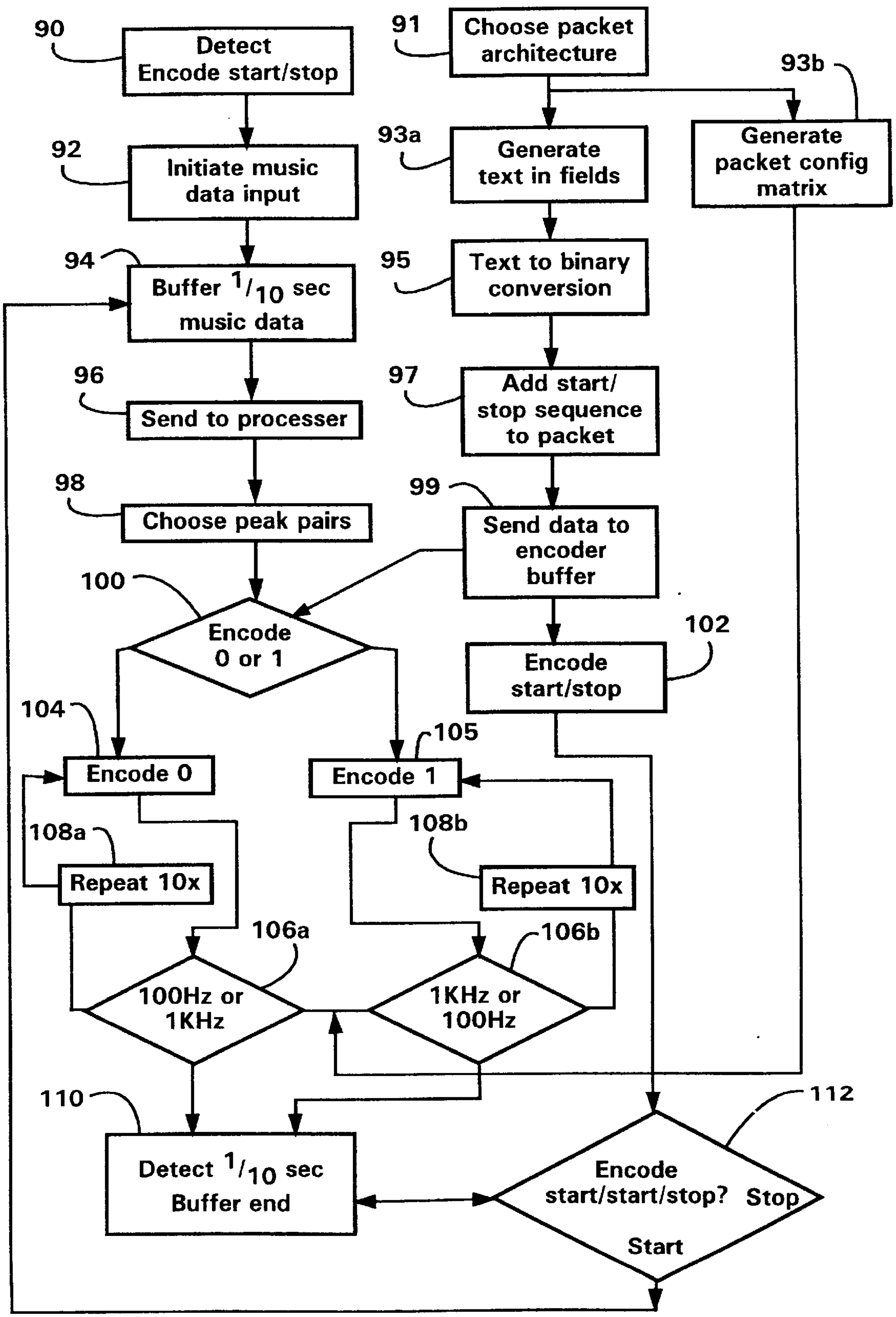
FIG. 9 is a flow chart diagram of an encoding process according to one preferred embodiment of the present invention.
Figure 11:
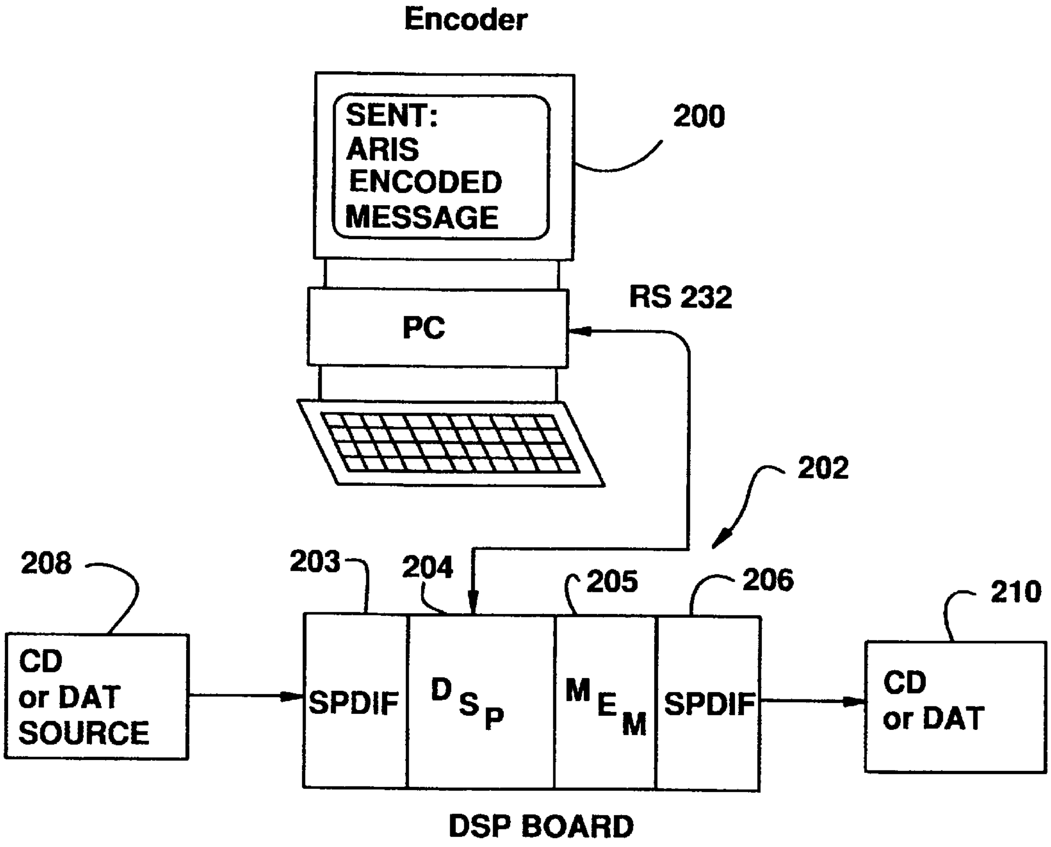
FIG. 11 is a block diagram of an encoder apparatus according to one preferred embodiment of the present invention.

A flow chart diagram of an encoding procedure according to one embodiment of the invention is provided by FIG. 9. An example of corresponding hardware to implement the encoding procedure is shown in FIG. 11.

A computer 200 such as a personal computer or other equivalent processor is provided in conjunction with a Digital Signal Processor (DSP) board 202. DSP board 202 includes SPDIF (Sony-Phillips Digital Interface Format) chips 203 and 206, a DSP chip 204, and a buffer memory chip 205. The SPDIF chip uses a digital standard intended for the consumer market. Alternatively, the digital interface chips may be implemented using AESEBU (Audio Engineering Society/European Broadcast Union) chips which utilize a digital standard intended for professionals. A host signal from a source 208, such as a CD, DAT, or live audio signal is fed into the DSP board 202.

At step 91, the packet architecture (i.e., either FIGS. 8A or 8B) is chosen by the operator at the PC 200. Text fields are then generated at step 93*a* from text input by the operator, and the packet configuration matrix is generated at step 93*b*. At step 95, text-to-binary conversion is performed to convert the inputted text into digital format. At step 97, start/stop sequences are added to the packet, and at step 99 the data is sent to the encode buffer in the memory of the DSP 202 via a standard communication link, such as an RS-232 transmission line. At step 102, the PC 200 then sends an encode start command to the DSP board 202.

At step 90, the DSP board detects an encode start command, and initiates data input from the source 208. At step 94, a predetermined time interval of the host signal from the source, such as 0.1 seconds of host signal, is read into the buffer 205, and sent to the DSP 204 at step 96 for appropriate identification and scaling of signal peaks at step 98 as described in detail above. At step 100, the DSP determines the appropriate information symbols, such as "1"s and "0"s, which should be encoded onto the signal interval in accordance with the data received from the PC 200. At steps 104 and 105, the appropriate symbol is encoded by peak manipulation. At steps 106*a* and 106*b*, the appropriate bit rate is determined. Based on the specified bit rate, the appropriate number of redundant events will be encoded by steps 108*a* and 108*b*. The end of the stored time interval is detected at step 110. At step 112, it is determined whether an encode start command or stop command has been transmitted by the PC 200. If no stop command has been received, the next time interval of host signal is read into memory at 94 and processing continues. Upon reception of a stop command after all data to be encoded has been transmitted, processing will be terminated at step 112.

Figure 10:
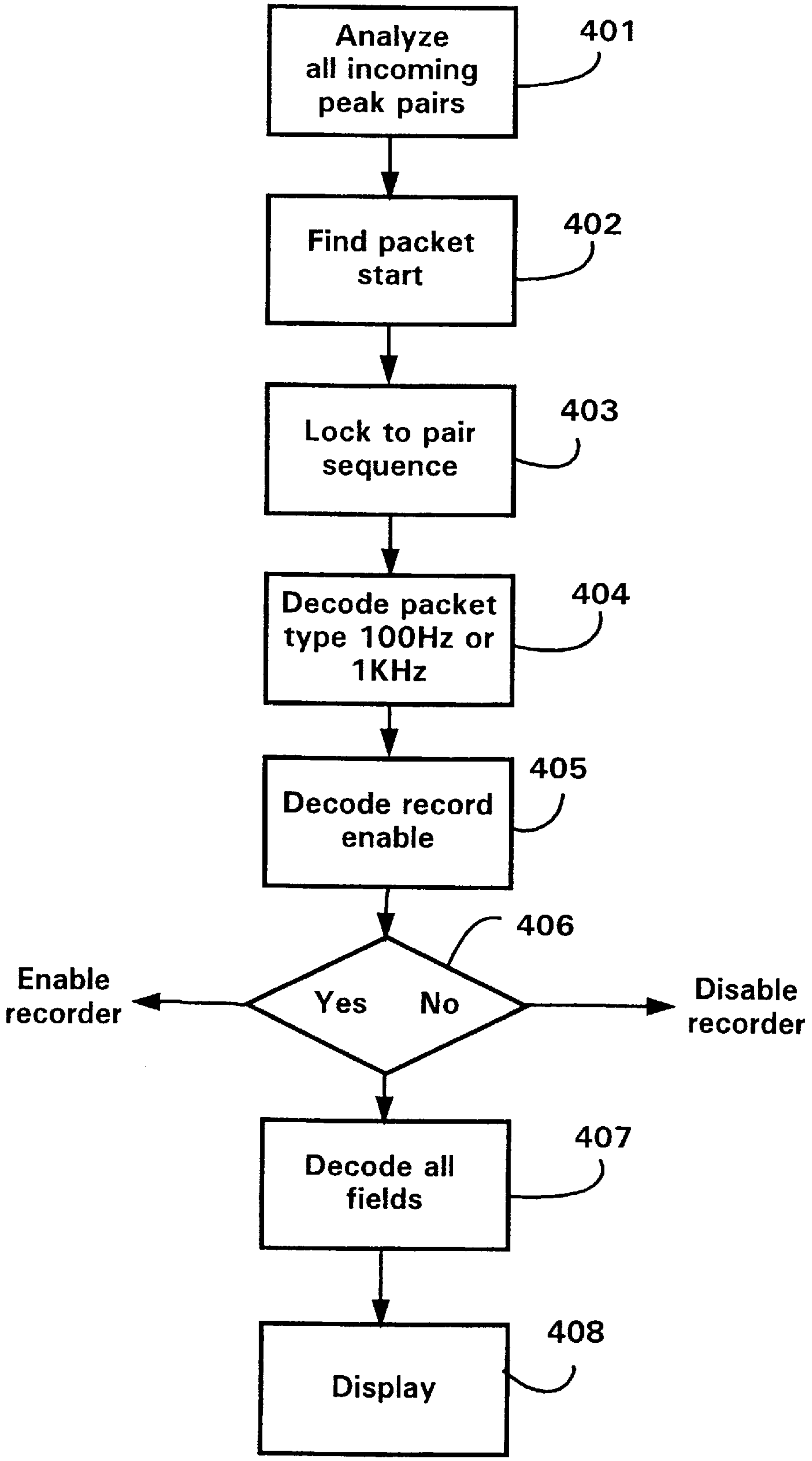
FIG. 10 is a flow chart diagram of a decoding process according to one preferred embodiment of the present invention.
Figure 12:
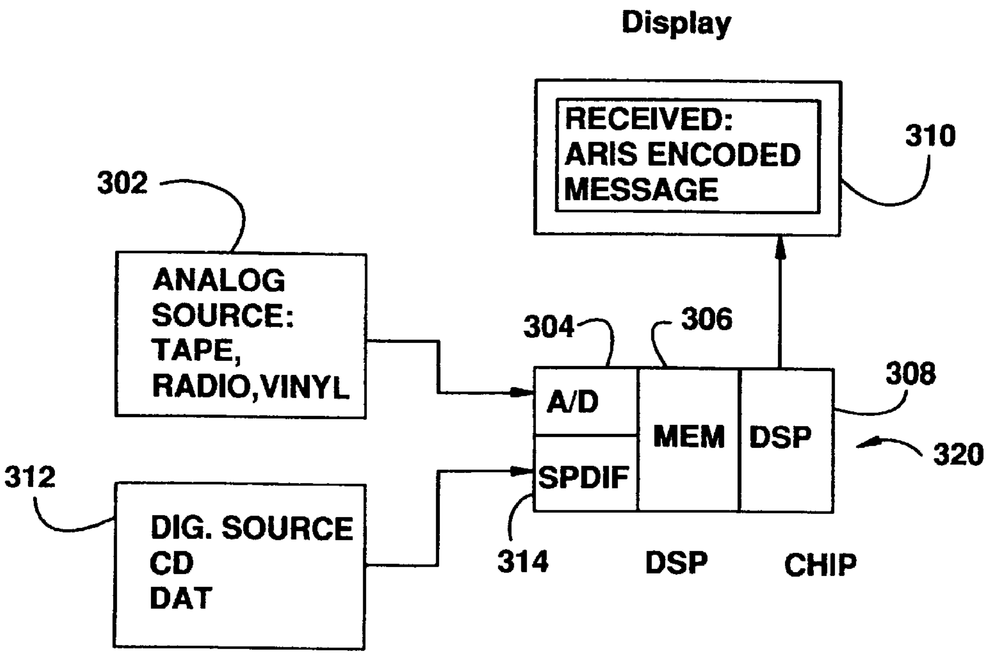
FIG. 12 is a block diagram of a decoder apparatus according to one preferred embodiment of the present invention.

FIG. 10 illustrates one example of a decoding procedure according to the invention, which can be carried out by hardware as shown in FIG. 12. A DSP board 320 including an analog-to-digital (A/D) converter 304, SPDIF 34, buffer memory 306 and DSP chip 308 is provided in a device such as a stereo receiver, along with a display 310, such as an LED or LCD or a CRT display. Analog sources such as radio broadcasts, tapes or LPs are inputted to A/D converter 304, while digital sources such as CDs and DATs are inputted to SPDIF 314. The incoming digital signal is then sent to buffer memory 306.

Referring to FIG. 10, at step 401 DSP 308 analyzes all incoming peak pairs, by appropriate scaling as discussed above. At step 402 the start of a packet is determined by detecting a packet start field, and synchronization to peak events is performed at step 403. Upon synchronization, packet decoding is carried out at step 404. The record enable field is first decoded at step 405. If copying is allowed, the recording device, if any, is enabled at step 406. If the record enable field indicates that copying is not allowed, the recording device is disable at step 406. The remaining data fields are then decoded at step 407, and the corresponding alphanumeric text is displayed on display 310 at step 408.

Figure 13:
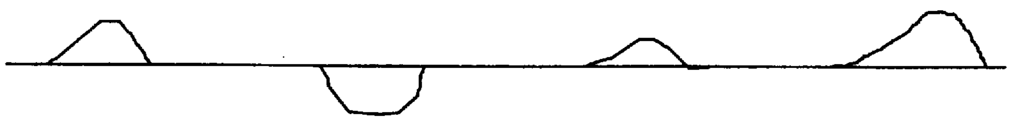
FIG. 13 is a waveform diagram showing an encoding signal according to an alternate embodiment of the present invention.

Another application of the invention is shown in FIGS. 13 and 14. Referring to FIG. 13, it will be recalled that the polarity and magnitude of alterations to signal peaks are functions of the information symbol, such as "1" or "0", to be encoded onto the host signal. FIG. 13 illustrates an example of such an alteration signal without the host signal.

This signal could be synchronously detected if the polarity changes were to occur in a predetermined sequence, and in such manner the alteration signal would function as a very narrow baseband spread spectrum signal, which would have the advantage of being highly survivable in noisy or distorting environments.

Figure 14A:
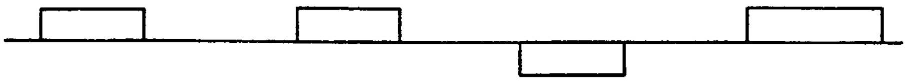
FIGS. 14*a* and 14*b* are waveform diagrams showing the use of the encoding signal of FIG. 13 in a spread spectrum decoding scheme.
Figure 14B:
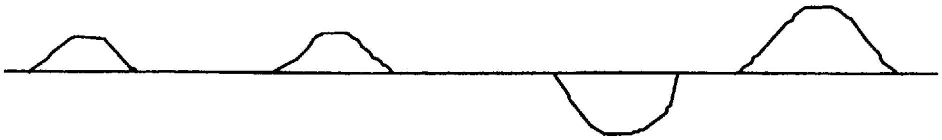

Encoding predetermined polarity sequences could be accomplished in addition to the peak alteration as shown in FIG. 6, if the peaks are modified to fall not merely into the nearest correct "0" or "1" band, but into the next correct band up or down depending on whether the predetermined sequence calls for the next polarity change to be up or down. An example of a predetermined sequence is shown in FIG. 14A. FIG. 14B shows a corresponding alteration signal encoded to correspond to sequence A. The effect of such encoding is to create an additional low bandwidth channel for encoding additional information.

For example, the sequence of FIG. 14A could represent a "1" bit, while another specific sequence could represent a "0" bit. Alternatively, a plurality of sequences could be defined which represent multiple bits. High bandwidth encoding still would be accomplished as in FIG. 6, with each peak falling into a specific band designating a particular information symbol. Additionally, the signal peak polarities would be correlated with predetermined sequence "templates" such as shown in FIG. 14A. High correlation would signify the corresponding information symbol associated with the sequence.

The invention having been thus described, it will be apparent to those skilled in the art that the same may be varied in many ways without departing from the spirit and scope of the invention. Any and all such modifications are intended to be included within the scope of the following claims.

What is claimed is:

1. A method for encoding information symbols onto an analog host signal, comprising the steps of:

identifying signal peaks of said host signal within a predetermined time interval, which peaks have values within a preselected range;

modifying the values of identified signal peaks to fall within a first predetermined band;

defining a set of a plurality of symbols wherein each symbol corresponds to a defined number of signal peaks; and further modifying the values of identified signal peaks within said first predetermined band, according to the symbol desired to be encoded in said predetermined time interval, such that the number of signal peaks remaining within a second predetermined band within said first predetermined band corresponds to said desired symbol.

2. A method according to claim 1, wherein said set of symbols consists of the set of binary digits.

3. A method according to claim 1, wherein said symbol sets includes alphanumeric characters.

4. A method according to claim 1, wherein the step of modifying the values of identified signal peaks to fall within a first predetermined band includes the step of multiplying said identified peaks by a constant.

5. A method according to claim 4, further comprising the step of multiplying modified signal peaks within said second predetermined band by the inverse of said constant.

6. A method for decoding information symbols encoded onto an analog host signal, comprising the steps of:

modifying signal peaks of said host signal within a predetermined time interval by a predetermined value so that said signal peaks fall within a first predetermined band;

defining a set of a plurality of symbols wherein each symbol corresponds to a defined number of signal peaks; and detecting signal peaks contained within a second predetermined band within said first predetermined band, and outputting the symbol corresponding to the number of signal peaks detected within said second predetermined band.

7. A method according to claim 6, wherein said symbol set consists of the set of binary digits.

8. A method according to claim 6, wherein said symbol sets includes alphanumeric characters.

9. A method according to claim 6, wherein the step of modifying includes the step of multiplying said peaks by a constant.

10. Apparatus for encoding information symbols onto an analog host signal, comprising:

means for identifying signal peaks of said host signal within a predetermined time interval, which peaks have values within a preselected range;

means for modifying the values of identified signal peaks to fall within a first predetermined band;

means for defining a set of a plurality of symbols wherein each symbol corresponds to a defined number of signal peaks; and means for further modifying the values of identified signal peaks within said first predetermined band, according to the symbol desired to be encoded in said predetermined time interval, such that the number of signal peaks remaining within a second predetermined band within said first predetermined band corresponds to said desired symbol.

11. Apparatus for decoding information symbols encoded onto an analog host signal, comprising:

means for modifying signal peaks of said host signal within a predetermined time interval by a predetermined value so that said signal peaks fall within a first predetermined band;

means for defining a set of a plurality of symbols wherein each symbol corresponds to a defined number of signal peaks;

means for detecting signal peaks contained within a second predetermined band within said first predetermined band, and means for outputting the symbol corresponding to the number of signal peaks detected within said second predetermined band.

12. Apparatus according to claim 11, wherein said outputting means comprises an alphanumeric display.

13. A method for encoding information onto an analog host signal, comprising the steps of:

defining a set of a plurality of informational symbols wherein each symbol corresponds to a predetermined amplitude band; and modifying the values of signal peaks of said host signal to fall within predetermined amplitude bands in accordance with a sequence of said informational symbols to be encoded in said host signal.

14. A method according to claim 13, wherein said symbols are binary digits.

15. A method according to claim 13, wherein said symbols are alphanumeric characters.

16. A method for encoding information onto an analog host signal, comprising the steps of:

defining a first set of symbols wherein each symbol corresponds to a predetermined amplitude band;

defining a second set of symbols wherein each symbol corresponds to a predetermined sequence of polarities of alterations to signal peaks of said host signal;

modifying the values of signal peaks of said host signal to fall within predetermined bands in accordance with a sequence of symbols of said first set to be encoded in said host signal, and to have polarities of signal peak alterations in accordance with a sequence of symbols of said second set to be encoded in said host signal.

17. A method according to claim 16, wherein said first and second set of symbols are binary digits.

18. A method according to claim 16, wherein said first and second set of symbols are alphanumeric characters.

* * * * *

UNITED STATES PATENT AND TRADEMARK OFFICE

CERTIFICATE OF CORRECTION

PATENT NO. : 5,828,325
DATED : October 27, 1998
INVENTOR(S) : Jack Wolosewicz
Kanaan Jemili It is certified that error appears in the above-identified patent and that said Letters Patent is hereby corrected as shown below:

Title page, item
[75] Inventors: second line delete "Wourn" and insert -- Woburn --.

Column 7, claim 4, line 40, after "identified" insert -- signal --.

Signed and Sealed this

Nineteenth Day of October, 1999

Attest:

Q. TODD DICKINSON

Attesting Officer

*Acting Commissioner of Patents and Trademarks*